United States Patent
Moroz

(10) Patent No.: US 8,354,736 B2
(45) Date of Patent: Jan. 15, 2013

(54) RECLAIMING USABLE INTEGRATED CIRCUIT CHIP AREA NEAR THROUGH-SILICON VIAS

(75) Inventor: Victor Moroz, Saratoga, CA (US)

(73) Assignee: Synopsys, Inc., Mountain View, CA (US)

( * ) Notice: Subject to any disclaimer, the term of this patent is extended or adjusted under 35 U.S.C. 154(b) by 444 days.

(21) Appl. No.: 12/687,358

(22) Filed: Jan. 14, 2010

(65) Prior Publication Data

US 2011/0169140 A1  Jul. 14, 2011

(51) Int. Cl.
  *H01L 29/40* (2006.01)
(52) U.S. Cl. ............... 257/621; 438/667; 257/E21.597; 257/E23.011
(58) Field of Classification Search .............. 438/667; 257/621, E21.597, E23.011
See application file for complete search history.

(56) References Cited

U.S. PATENT DOCUMENTS

| | | | |
|---|---|---|---|
| 7,484,198 B2 | 1/2009 | Lin et al. | |
| 7,772,123 B2 * | 8/2010 | Birner et al. ............. | 438/700 |
| 2005/0121768 A1 | 6/2005 | Edelstein et al. | |
| 2006/0290002 A1 | 12/2006 | Arana et al. | |
| 2007/0034517 A1 | 2/2007 | Tsao et al. | |
| 2008/0079121 A1 | 4/2008 | Han | |
| 2009/0191708 A1 | 7/2009 | Kropewnicki et al. | |
| 2010/0193954 A1 * | 8/2010 | Liu et al. ................ | 257/751 |
| 2010/0237502 A1 * | 9/2010 | Yu et al. ................. | 257/751 |

OTHER PUBLICATIONS

Thompson S.E. et al., "A 90-nm Logic Technology Featuring Strained-Silicon," IEEE Transactions on Electron Devices, 2004, 8 pp.
Karmarkar A.P. et al., "Performanace [sic] and Reliability Analysis of 3D-Integration Structures Employing Through Silicon Via (TSV)," IEEE 47th Annual Int'l Reliability Physics Synposium, Montreal, 2009, pp. 682-687.
Wong B. et al, "Nano-CMOS Design for Manufacturability—Robust Circuit and Physical Design for Sub-65nm Technology Nodes," A. John Wiley & Sons, Inc., New Jersey, 2009, title and copyright pages and pp. 126-184, 296-299, 319-321, 324-332, 374 and 378-380.
ISR mailed Apr. 15, 2011 in PCT/US2011/020697.

\* cited by examiner

*Primary Examiner* — Trung Q Dang
(74) *Attorney, Agent, or Firm* — Warren S. Wolfeld; Haynes Beffel & Wolfeld LLP

(57) ABSTRACT

Roughly described, an integrated circuit device includes a substrate including a via passing therethrough, a strained electrically conductive first material in the via, the first material tending to introduce first stresses into the substrate, and a strained second material in the via, the second material tending to introduce second stresses into the substrate which at least partially cancel the first stresses. In an embodiment, SiGe is grown epitaxially on the inside sidewall of the via in the silicon wafer. SiO2 is then formed on the inside surface of the SiGe, and metal is formed down the center. The stresses introduce by the SiGe tend to counteract the stresses introduced by the metal, thereby reducing or eliminating undesirable stress in the silicon and permitting the placement of transistors in close proximity to the TSV.

26 Claims, 10 Drawing Sheets

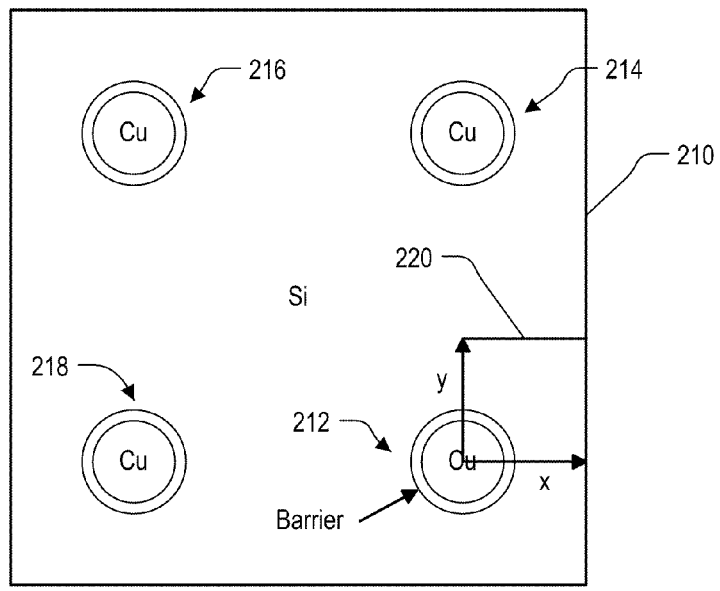
FIG. 2A
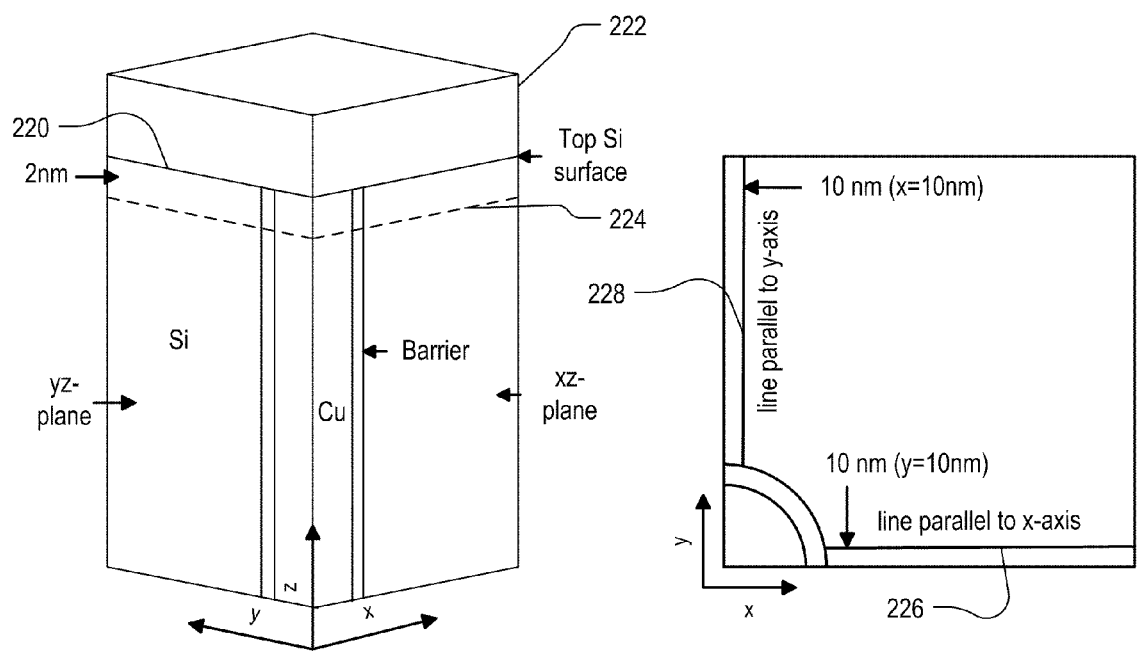
FIG. 2B
FIG. 2C

RECLAIMING USABLE INTEGRATED CIRCUIT CHIP AREA NEAR THROUGH-SILICON VIAS

BACKGROUND

The present invention relates to integrated circuit devices having through-silicon vias, and more particularly to a technique for reclaiming usable integrated circuit chip area near through-silicon vias.

It has long been known that semiconductor materials such as silicon and germanium exhibit the piezoresistance effect (mechanical stress-induced changes in electrical resistance). See for example C. S. Smith, "Piezoresistance effect in germanium and silicon", Phys. Rev., vol. 94, pp. 42-49 (1954), incorporated by reference herein. The piezoresistance effect has formed the basis for certain kinds of pressure sensors and strain gauges, but only recently has it received attention in the manufacture of integrated circuits.

Methods have been developed to model the impact of stress on the behavior of integrated circuit devices at the level of individual transistors. These methods include, for example, full-scale analysis with a Technology Computer Aided Design (TCAD) system; and a method described in U.S. patent application Ser. No. 11/291,294, filed Dec. 1, 2005, Docket No. SYNP 0693-1, incorporated herein by reference.

Behaviors characterized by the various methods for analyzing stress impact at the level of individual transistors can be used to derive circuit level parameters (e.g. SPICE parameters) of the device for subsequent analysis of the circuit at macroscopic levels. Such analysis can help predict whether the circuit will operate as intended, and with what margins, or whether the design or layout needs to be revised. For transistors affected by stress caused by shallow trench isolation (STI) regions in proximity to transistor channel regions, revisions can often be made by applying certain general rules-of-thumb, such as increasing the width of any transistor that, according to the stress analysis, turns out to be weaker than expected. Other techniques can also be used to relax known undesirable stress, to introduce known desirable stress, or merely to improve uniformity throughout the layout. See U.S. Patent Publication No. 2007-0202663, Docket No. SYNP 0858-1, incorporated herein by reference.

As integrated circuit scaling becomes increasingly difficult with each technology node, three-dimensional (3D) integration technologies have emerged as viable alternatives to achieve the requisite integration densities. 3D integration improves system performance and allows heterogeneous integration of circuit blocks. Many 3D integration techniques include vertical interconnects using through-silicon vias (TSVs). These structures are complex geometries consisting of various materials with widely varying mechanical properties. During the manufacturing process, these geometries undergo thermal cycling that introduces thermo-mechanical stresses in the surrounding silicon. The TSVs also introduce thermal mismatch stresses in the active silicon and affect the carrier mobility. These stresses alter the electron and hole mobilities near the TSV, thereby introducing undesirable transistor variations.

A typical response to these stresses is to define an exclusion zone around them, and to avoid placing transistors within the exclusion zones. For a typical 5 um diameter TSV, the exclusion zone can be as large as 5-10 um wide, which translates into an unusable area for each TSV of 180 to 500 um$^2$. With a roadmap predicting around 10,000 TSVs per chip, this adds up to an enormous 1.8 mm$^2$-5 mm$^2$ of otherwise usable space per chip that is lost due to the use of TSVs. It would be highly desirable to find ways of reclaiming some of that area so that it can be used beneficially.

SUMMARY

Roughly described, an integrated circuit device includes a substrate including a via passing therethrough, a strained electrically conductive first material in the via, the first material tending to introduce first stresses into the substrate, and a strained second material in the via, the second material tending to introduce second stresses into the substrate which at least partially cancel the first stresses. In an embodiment, SiGe is grown epitaxially on the inside sidewall of the via in the silicon wafer. SiO2 is then formed on the inside surface of the SiGe, and the conductive metal is formed in the center. The stresses introduce by the SiGe tend to counteract the stresses introduced by the metal, thereby reducing or eliminating undesirable stress in the silicon and permitting the placement of transistors in very close proximity to the TSV.

The above summary of the invention is provided in order to provide a basic understanding of some aspects of the invention. This summary is not intended to identify key or critical elements of the invention or to delineate the scope of the invention. Its sole purpose is to present some concepts of the invention in a simplified form as a prelude to the more detailed description that is presented later. Particular aspects of the invention are described in the claims, specification and drawings.

BRIEF DESCRIPTION OF THE DRAWINGS

The invention will be described with respect to specific embodiments thereof, and reference will be made to the drawings, in which:

FIG. 2A is a plan view of a simplified structure of a region of a silicon substrate containing four TSVs FIG. 2B is perspective view of the three-dimensional volume below the box 220 in FIG. 2A.

FIG. 2C is a plan view of an xy-plane in the volume of FIG. 2A, as indicated by broken lines 224 in FIG. 2B.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

Stress Consequences of TSVs

The stress consequences of TSVs can vary depending on wafer and lithographic orientation relative to the crystallographic directions of the wafer material. As used herein, a wafer orientation is defined by its normal direction, and currently the {100} family of directions is standard in semiconductor fabrication. Because of crystallographic symmetry, all the specific directions in the {100} family have the same piezoresistance properties. Whereas a family of wafer orientation directions is denoted herein with curly brackets, if a specific direction is referenced herein, it is enclosed in parentheses, such as (100). Also as used herein, a wafer has a "primary flat" direction. Historically, a wafer was generally disc-shaped, except for one section along the circumference which was flat. The "primary flat" direction of a wafer is defined herein as a direction parallel to that flat section. Most modern wafers no longer have flat sections, but rather use some other feature (such as a notch) to define the "primary flat" direction; even though there is no longer a flat section, the direction defined by the feature is still referred to herein as the "primary flat direction". Further, most modern lithographic processes orient all transistors such that their longitudinal direction is in the <110> family of crystallographic directions. A transistor oriented in a <110> direction is sometimes referred to herein as having the "standard orientation". Again, as used herein, whereas a family of lithographic orientation directions is denoted with angle brackets, if a specific direction is referenced herein, it is enclosed in square brackets, such as [110]. All the specific directions in the <110> family have the same piezoresistance properties. As used herein, the "longitudinal" direction of a transistor is the direction parallel to current flow in the transistor, and the "transverse" direction of a transistor is the direction cross-wise to the current flow in the transistor. Both are considered "lateral" directions, meaning parallel to the substrate surface. The "vertical" direction is perpendicular to the "lateral" directions.

Figure 1:
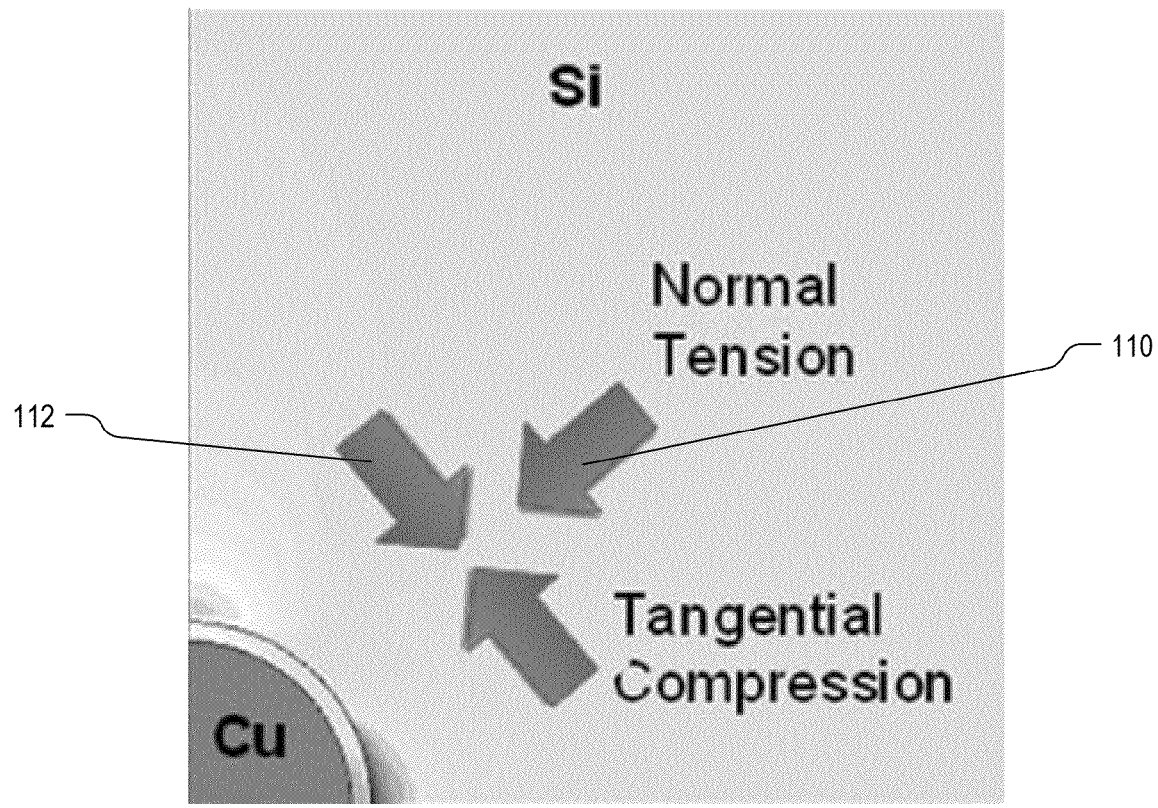
FIG. 1 is a diagram showing qualitatively some of the stresses that a TSV introduces into the surrounding silicon.

FIG. 1 is a diagram showing qualitatively some of the stresses that a TSV introduces into the surrounding silicon. During the process of fabricating a silicon wafer with TSV's, the structure undergoes cooling from a high temperature such as 250 degrees C., down to room temperature (~25 degrees C.). As the structure cools, both the silicon and copper materials shrink, but the copper shrinks more than the silicon. This causes tensile strain in the copper, which in turn causes tensile stress in the silicon in a direction normal to the TSV circumference (i.e. radially), as indicated by arrow 110. The tensile stress in the normal direction further causes compressive stress in the silicon in a direction tangential to the TSV circumference, as indicated by arrows 112. The magnitudes of the stresses are most pronounced near the TSV, and fall off with increasing distance away from the edge of the TSV. In addition, because the silicon is fixed in a crystal lattice structure, the stresses also tend to differ by small amounts at different angular positions relative to the crystal axes. As used herein, a particular directional component of the stress is considered negative if it is compressive, or positive if it is tensile.

It is noted that the SiO2 dielectric barrier surrounding the copper conductor in each of the TSVs does affect the stresses introduced into the silicon, but it does so by absorbing or buffering some of the strain in the copper. That is, the SiO2 is somewhat pliable, and will stretch somewhat radially inward when pulled by the copper during cooling. This effect reduces the physical deformation (i.e. strain) that the copper retains after cooling, but significant strain still remains. It is that remaining strain which introduces the stresses into the silicon as illustrated in FIG. 1.

FIGS. 2A, 2B and 2C (collectively FIG. 2) illustrate a simplified structure of a region of a silicon substrate 210 containing four TSVs 212, 214, 216 and 218. FIG. 2A is a plan view of the region. In this embodiment, the wafer is oriented in a (001) crystal direction, and the primary flat is oriented parallel to the [110] direction, which is the same as the x axis as shown in the figure. Each TSV is represented in the plan view by a circular copper via surrounded by an SiO2 insulating barrier, although other materials can be used in other embodiments for both the conductor and the insulating barrier.

In order to understand the effect of these stresses on carrier mobility (and therefore transistor performance), the stresses can be modeled and analyzed using a finite element method (FEM) based 3D simulator. In some simulations described herein the TSV is copper and in others it is tungsten. In a simplification due to the symmetry of silicon crystal lattice, reflective boundary conditions are assumed that permit simulating the stress consequences of only one-quarter of one TSV 212, as represented by the box 220. Directions x and y are identified on the lines of box 220. FIG. 2B is a perspective view of the three-dimensional volume below the box 220. This view identifies directions x, y and z. Above the box 220 is a top portion 222, which is a simulated smear material for approximating the mechanical effects of an interconnect structure on top of the wafer with the mechanical properties being derived from those of its constituents. If the TSV pitch is 15 microns, for example, then the TSV diameter might be 3 microns, and the barrier thickness might be 0.18 microns. FIG. 2C is a plan view of a z-normal plane in the structure of FIG. 2B, situated 2 nm below the top silicon surface 220 as indicated by the broken lines 224 in FIG. 2B.

In the simulation, the carrier mobility change in the plane of FIG. 2C is determined for [001] wafer orientation and [1$\overline{1}$0] primary flat orientation. It is found that the carrier mobility variation in the active region of an n-silicon wafer is significantly smaller than that in a p-silicon wafer.

Figure 3A:
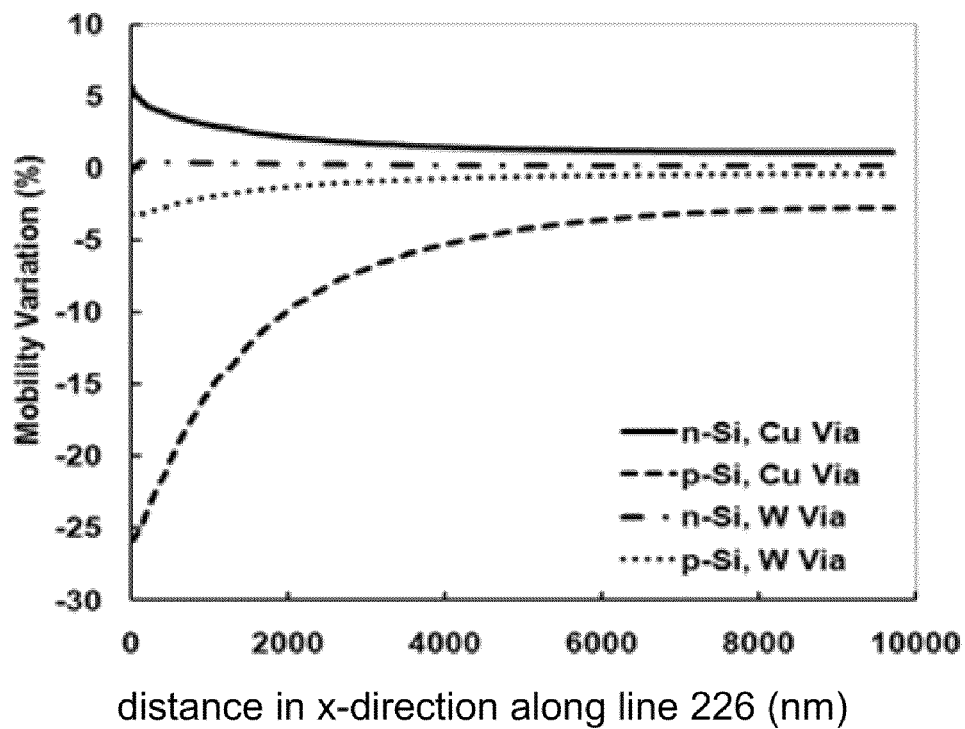
FIG. 3A is a plot of the carrier mobility variation along line 226 in FIG. 2C.
Figure 3B:
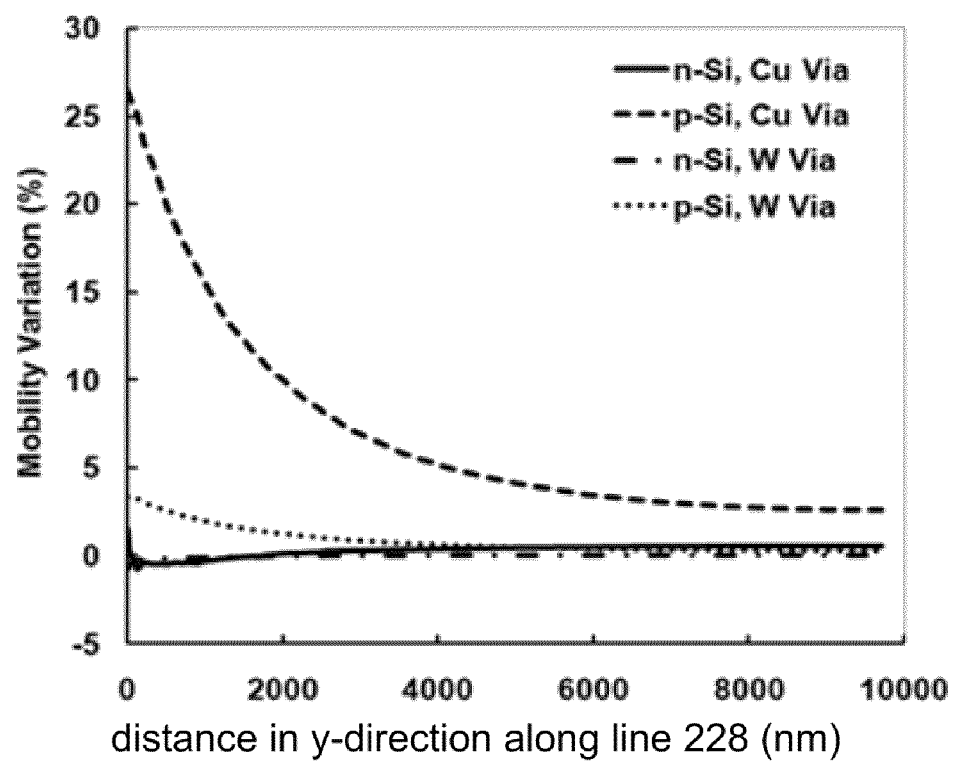
FIG. 3B is a plot of the carrier mobility variation along line 228 in FIG. 2C.

FIG. 3A is a plot of the carrier mobility variation along a line 226 in FIG. 2C, which lies in the z-normal plane of FIG. 2C, and is parallel to the x axis and 10 nm away from the xz plane (i.e., y=10 nm). FIG. 3B is a plot of the carrier mobility variation along a line 228 in FIG. 2C, which lines in the z-normal plane of FIG. 2C, and is parallel to the y axis and 10 nm away from the yz plane (i.e., x=10 nm). Four plots are shown in each figure: one for each combination of n-silicon or p-silicon wafer material, and copper or tungsten TSV material. In both figures the carrier mobility variation is plotted as a function of distance from the barrier edge to a distance of about 10 microns from the barrier edge. Note that the plots assume only thermal mismatch stress, and do not take into account any built-in stress from the tungsten deposition process.

It can be seen that the change in the carrier mobility due to mechanical stress depends on the location. Carrier mobility impact is higher for locations closer to the TSV, and lower for locations father from the TSV. Moreover, the carrier mobility impact is different in n- and p-silicon, different depending on the direction from the TSV, and different depending on the material properties of the TSV. In n-silicon, carrier mobility is affected only slightly in any direction and distance from the TSV. Most significant is the impact that copper TSVs have on carrier mobility in p-silicon. Carrier mobility along the x direction in p-silicon ranges from a decrease of approximately 25% immediately adjacent to the TSV, to a decrease of only 5% at a distance of about 5 microns from the TSV. On the other hand, carrier mobility along the y direction ranges from an increase of approximately 25% immediately adjacent to the TSV, to an increase of only 5% at a distance of about 5 microns from the TSV. Though not shown in FIG. 3A or 3B, simulations also reveal that the change in carrier mobility gradually transitions from negative at the x-axis to positive at the y-axis, along a fixed radius arc centered at the center of the TSV.

Because the effect on mobility can be significant very close to the TSV, the prior art generally prescribes a "keep-away zone", or "exclusion zone", within which transistor placement is to be avoided. For example, in Vandevelde, et al., "Thermo-mechanics of 3D-Wafer Level and 3D Stacked IC Packaging Technologies" 9th Int. Conf. on Therm., Mech. and Multi-Physics Simulations and Exper. in Microelec. and Micro-Systems, (EuroSimE), 2008, pp. 1-7, incorporated herein by reference, the keep-away zone is prescribed separately for p-channel and n-channel transistors, and separately for transistor current direction positions parallel and transverse to the [110] crystal direction. The keep-away zone appears to be defined as a circle centered at the center of the TSV, and having a radius equal to the largest distance (over all angular positions) from the center of the TSV at which the mobility change exceeds 5% in magnitude. For the particular materials studied by Vandevelde et. al., the keep-away zone was found to be quite large, especially for p-channel transistors and larger TSV diameter.

Reclaiming Chip Area

Figure 4:
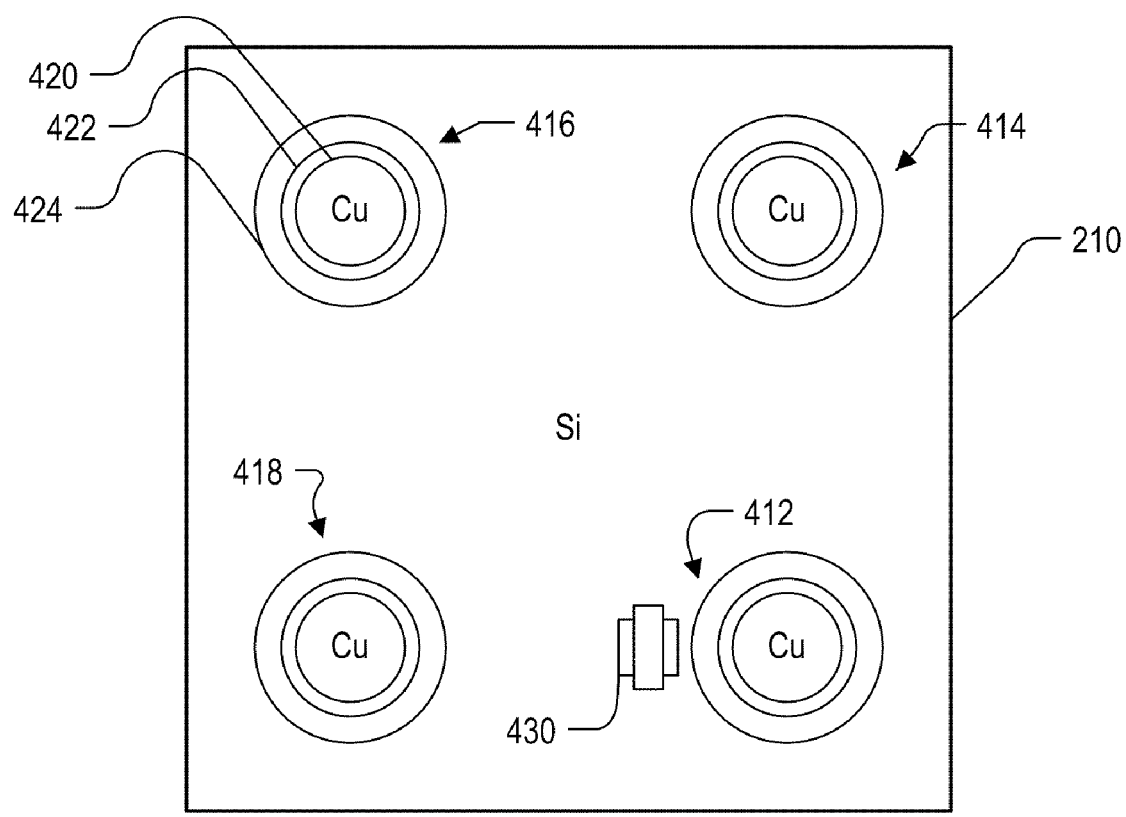
FIG. 4 is a plan view of the silicon substrate region of FIG. 2A, modified in accordance with features of the invention.

FIG. 4 is a plan view of the silicon substrate region of FIG. 2A, modified in a way that allows reclamation of some or all of the exclusion zone adjacent to TSVs, so that these areas can be used for transistors. Four TSVs 412, 414, 416 and 418 are shown in FIG. 4. Each TSV includes the metal conductor material 420, surrounded by the dielectric barrier material 422 as in the conventional structure. In TSVs 412, 414, 416 and 418, however, there is also an additional stress compensation material 424 surrounding the dielectric barrier material 422 in each of the TSVs. The conductor 420 material is preferably a metal, and in FIG. 4 it is copper. In other embodiments it can be tungsten or any other conductive material. The dielectric barrier 422 material is preferably SiO2, but again, in other embodiments it can be any other material. The stress compensation material 424 is chosen, both in size and material content, to introduce stress into the surrounding silicon that is at least partly opposite that introduced by the conductor material 420. For example, if the conductor material is a metal, which tends to introduce tensile stress radially into the surrounding silicon, then the stress compensation material 424 is preferably SiGe, which tends to introduce compressive stress radially into the surrounding silicon. The stresses that the two materials tend to introduce into the silicon at least partly cancel each other in magnitude in at least one direction laterally relative to the via.

As used herein, a material "tends" to introduce a particular stress into the substrate if, absent other stress sources acting on the substrate, the particular stress would be present in the substrate when the strained material is present, and would not be present when the strained material is not present. However, for simplicity of discussion, a material is sometimes said herein to "introduce" a particular stress into the substrate even if, after additional contributions from other stress sources, the net stress that results in the substrate is different. That is, the words "tend to" are sometimes omitted herein merely for simplicity of discussion.

Figure 5:
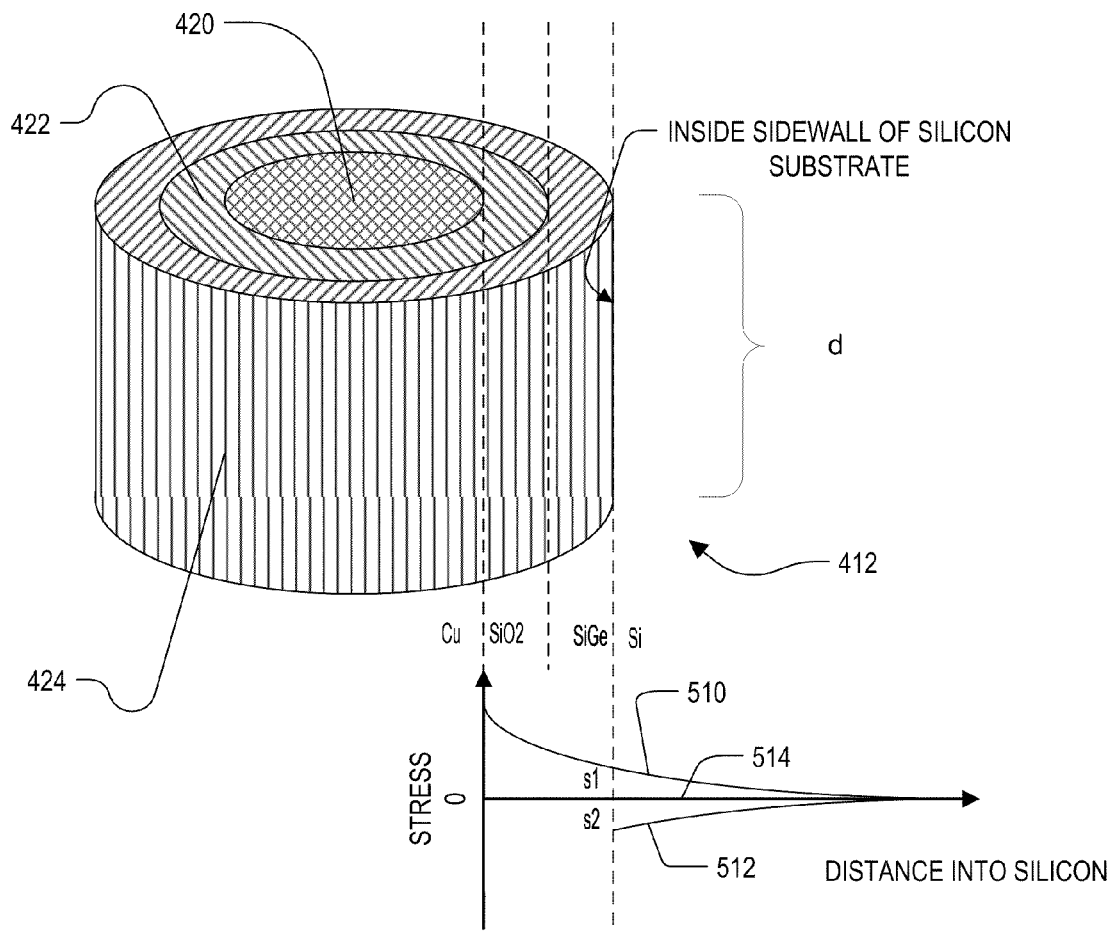
FIG. 5 is a perspective view of one of the TSVs of FIG. 4.

FIG. 5 is a perspective view of one of the TSVs 412 of FIG. 4. The stress compensation material 424 forms a cylinder or sleeve which has roughly the same vertical depth as the conductor material 420, which in present technology means they both extend all the way through the wafer to backside. As with all the structural diagrams herein, FIG. 5 is not intended to be drawn to scale. Note that as used herein, the sleeve of stress compensation material 424 is said to "surround" the conductor material 420, even though it is separated from the conductor material 420 by another sleeve of material (the dielectric material 422).

Also shown in FIG. 5 are plots of the stress introduced into the surrounding material(s). These plots show stress in the radial direction in regions of the material extending into the silicon in the X-direction, but the shapes of the curves would be roughly the same in any radial direction into the silicon. Curve 510 describes the radial stress that the conductive material 420 tends to introduce into the surrounding materials at regions located at various distances from the edge of the material 420. The stress is tensile (i.e. positive) in this embodiment, and its magnitude is largest adjacent the edge of the material 420, and falls off with increasing distance away from the TSV 412. At the inner edge of the hole in the silicon (which as used herein is also considered the outer edge of the TSV 412), the stress has a magnitude of s1. Similarly, curve 512 describes the radial stress that the stress compensation material 424 tends to introduce into the surrounding materials at regions located at various distances from the outer edge of the material 424. This stress is compressive (i.e. negative) in this embodiment, and again its magnitude is largest adjacent the edge of the material 424, and falls off with increasing distance away from the TSV 412. At the outer edge of the TSV 412, the stress that the stress compensation material 424 tends to introduce into the silicon has a magnitude of s2. In the embodiment of FIG. 5, s1=s2 so that the stresses cancel completely, leaving zero net stress introduced by the TSV in the adjacent silicon. In addition, in the embodiment of FIG. 5, the two stress components tend to fall off equally at equal distances into the silicon, so that the stresses continue to cancel completely, leaving zero net stress introduced by the TSV at all distances into the silicon. This is illustrated by the curve 514 in FIG. 5.

In other embodiments, it is not essential that the stresses cancel completely, or that they cancel each other exactly at all distances into the silicon. So long as the net stress is tolerable or accommodated by the design, layout or fabrication process, then non-zero net stresses are acceptable. Any reduction in the magnitude of the stress that would have been introduced by the conductive material 420 is considered herein to be advantageous. For some purposes it may even be advantageous if the stress that the stress compensation material 424 introduces into the silicon more than compensates for that of the conductor material 420, for example if stress engineering favors stress of one sign but the conductor material 420 would introduce stress of the opposite sign. Note further that whereas the stress that would be introduced by copper and other metals is positive, another conductive material 420 might tend to introduce a negative stress. If so, then a material should be chosen for the stress compensation material 424 which would introduce a positive stress into the silicon.

Because of the stress compensation material 424, a transistor such as 430 (FIG. 4) can be placed very close to the edge of the TSV, thereby reclaiming chip area that would otherwise have been lost to an exclusion zone. The transistor 430 is, for example a P-channel transistor, located along the X-axis from the TSV 412, and so close to the TSV 412 that it would be within the exclusion zone. As used herein, no distinction is intended between portions of a transistor or other integrated feature which are disposed in the substrate body itself, or disposed in an overlying layer. For example, all of the features of an integrated circuit, including wells, diffusions, STI regions, gate dielectric layers, gate conductors and cap layer materials, are all described equivalently herein as being either "on" the substrate or "in" the substrate, and no distinction is intended between the two words.

As set forth above, two example materials that are often mentioned for the conductor in TSVs are copper and tungsten. The stresses introduced into the silicon due to a tungsten conductor are due to its internal structure and are independent of temperature. The stresses introduced into the silicon due to SiGe as a stress compensation material 424, are also due to its internal structure and are also independent of temperature. Therefore, the net stress shown as curve 514 in FIG. 5 can be constant for all temperatures in a predefined operating range. Copper stress, however, is different. It is created due to thermal mismatch as described above, and reduces with temperature. Therefore, if SiGe is used as the stress compensation material 424, and the conductor 420 is copper, then the net stress introduced into the silicon due to the combination of materials will vary as the device heats up during operation. With this combination of materials, therefore, it is preferable that the SiGe composition and thickness be chosen so as to achieve a desired net stress (such as zero) in the silicon when the device is at some predetermined temperature, recognizing that it will vary above and below that stress level at temperatures that deviate from the predetermined temperature. Alternatively, instead of a crystalline material like SiGe, the stress compensation material 424 may be another amorphous material which introduces a thermal mismatch stress which is opposite to copper over the desired operating temperature range.

In the TSV of FIG. 5, the buffer material 422 is SiO2 and provides the function of a dielectric barrier between the conductor 420 and the surrounding doped silicon. In a conventional TSV, the thicker this barrier is radially, the smaller the capacitance is between the conductor 420 and the silicon. The stress compensation material 424 is preferably not doped with impurities, because the impurities would increase the electrical conductance of the stress compensation material. Using an undoped stress compensation material therefore provides additional dielectric thickness between the conductor 420 and the conductive silicon, offering the additional benefit of further reducing the capacitance.

Figure 6:
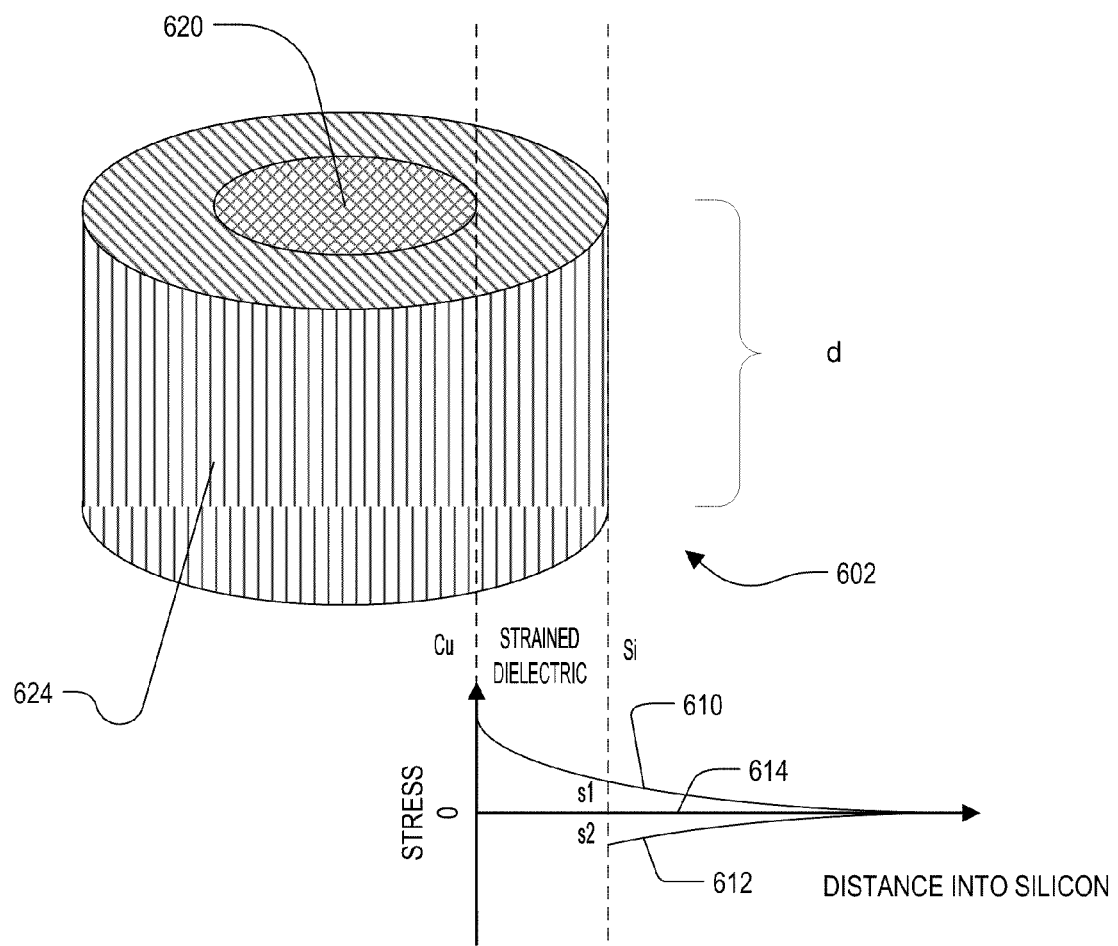
FIG. 6 is a perspective view of another embodiment of a TSV incorporating features of the invention.

FIG. 6 is a perspective view of another embodiment of a TSV 602, which can replace each of the TSVs 412, 414, 416 and 418 in FIG. 4. It is similar to the TSV of FIG. 5, except that instead of two separate materials 422 and 424 surrounding the conductor material 420, one to perform a dielectric function and one to provide stress cancelation, the TSV 602 combines those two functions into a single material 624. For example, material 624 may be a dielectric material containing impurities which tend to introduce stress into the surrounding silicon which at least partially cancels the stress that the conductor material 620 tends to introduce into the surrounding silicon.

The plots shown in FIG. 6 are similar to those in FIG. 5. Curve 610 describes the radial stress that the conductive material 620 tends to introduce into the surrounding materials at regions located at various distances from the edge of the material 620. The stress is tensile (i.e. positive) in this embodiment, and its magnitude is largest adjacent the edge of the material 620, and falls off with increasing distance away from the TSV 602. At the outer edge of the TSV 602, the stress has a magnitude of s1. Similarly, curve 612 describes the radial stress that the combined dielectric/stress compensation material 624 tends to introduce into the surrounding materials at regions located at various distances from the edge of the material 624. This stress is compressive (i.e. negative) in this embodiment, and again its magnitude is largest adjacent the edge of the material 624, and falls off with increasing distance away from the TSV 602. At the outer edge of the TSV 602, the stress that the material 624 tends to introduce into the silicon has a magnitude of s2. In the embodiment of FIG. 6, s1=s2 so that the stresses cancel completely, leaving zero net stress introduced by the TSV in the adjacent silicon. In addition, in the embodiment of FIG. 6, the two stress components tend to fall off equally at equal distances into the silicon, so that the stresses continue to cancel completely, leaving zero net stress introduced by the TSV at all distances into the silicon. This is illustrated by the curve 614 in FIG. 6.

As with the embodiment of FIG. 5, in other embodiments, the stress introduced by the conductive material 620 may be negative and that introduced by the material 624 positive. Nor is it essential that the stresses cancel completely, or that they cancel each other exactly at all distances into the silicon, or that the net stress in the silicon have a larger or smaller magnitude than that from the conductor 620 alone. Preferably the net stress is smaller in magnitude, but for some purposes it may even be advantageous if the stress introduced by the material 624 more than compensates. Again, because of the stress introduced into the silicon by the material 624, transistors can be placed very close to the edge of the TSV, thereby reclaiming chip area that would otherwise have been lost to an exclusion zone.

It will be appreciated that still other embodiments exist in which the dielectric material and the stress compensation material are interchanged compared to the arrangement in FIG. 5, with the stress compensation material adjacent the conductive material 420, and the dielectric material surrounding the stress compensation material. This arrangement is less preferred than that of FIG. 5, since the FIG. 5 arrangement permits the partial stress relief afforded by a dielectric material such as SiO2 to buffer the forces exerted on the conductive material by the stress compensation material and vice-versa. Without the buffer, these forces are more likely to cause cracking. It will be appreciated that still further embodiments are possible, with varying advantages and disadvantages, including more than one sleeve of one material or the other, or sleeves of the two kind of material interleaved with each other. Still further, additional sleeves of still different material or materials could be added. Still further, one or more sleeves of SiGe as a stress compensation material, can be grown with a non-uniform Ge mole fraction across its radial thickness. Yet other variations will be apparent. For many of the embodiments including that of FIGS. 5 and 6, it is desirable for the stress compensation layer to have a vertical depth which is comparable to that of the stress-inducing conductor, as this causes the stress fall-off rates to be similar. It is also desirable for the stress compensation layer to be thin in order to minimize the lateral area that it occupies. One significant advantage of using SiGe to compensate Cu stress is that several tens of nanometers of SiGe is sufficient to cancel stress generated by Cu with a diameter of several microns.

Method of Making a Device

Figure 7:
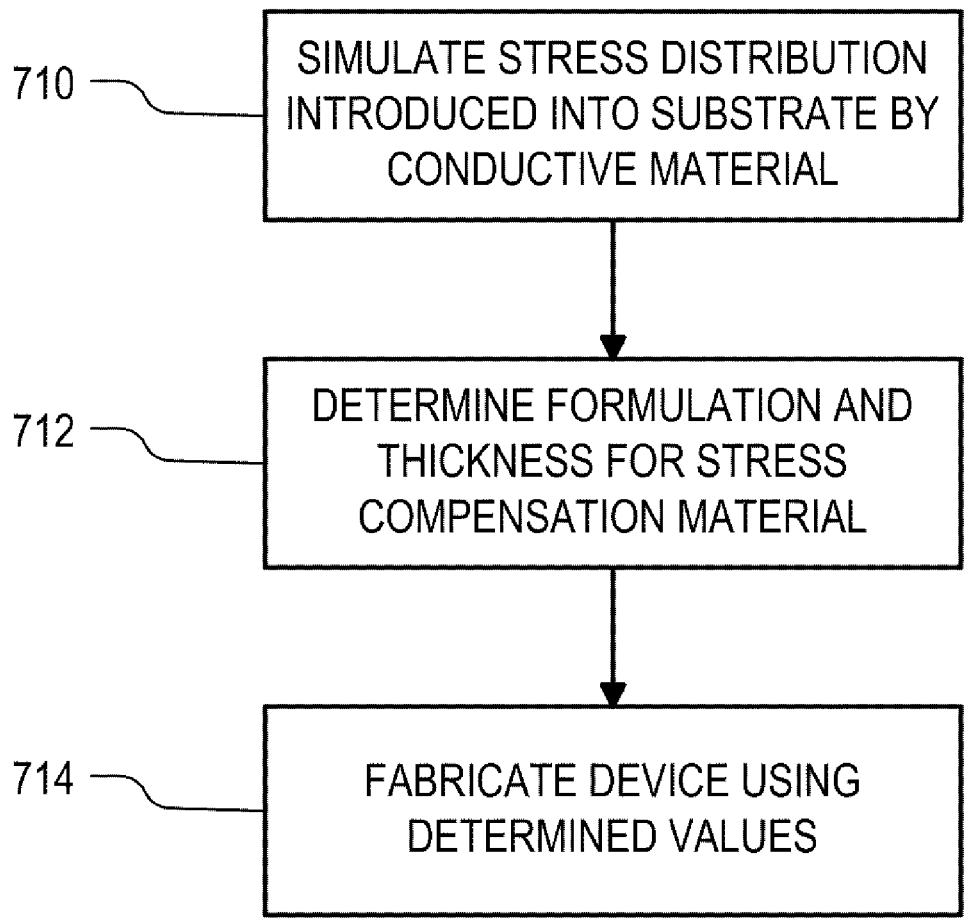
FIG. 7 is a flow chart of a technique for making a device using aspects of the invention.

FIG. 7 is a flow chart of a technique for making a device which makes use of aspects of the invention. It is assumed that separate materials will be used for the dielectric barrier material 422 and the stress compensation material 424 as in the embodiment of FIG. 5. It is also assumed that the following information is already known: diameter of the hole in the wafer, depth of the hole (i.e. thickness of the wafer after final thinning step), mechanical properties of the TSV conductor material, and the strain that the conductor material will exhibit after fabrication. In step 710, based on this information, the stress distribution that the conductor material will tend to introduce into the surrounding substrate material is estimated. The estimate, which can be made using a TCAD simulator such as the Sentaurus tools available from Synopsys, Inc., preferably takes into account the mechanical properties of the dielectric barrier material 422, including the extent to which its softness reduces the strain in the conductor material 420. Radial uniformity can be assumed in a simplification, though preferably the crystal lattice structure of the substrate is taken into account instead.

In one embodiment, the estimate is calculated as coefficients of an equation having a predetermined form, or preferably, the estimate is calculated merely as a matrix of values representing stress values at each of a plurality of positions within a "subject" region around the TSV. Typically the subject region will be a rectangle or circle that surrounds the TSV and is large enough to include the previously assumed exclusion zone, but in a particular embodiment the subject region could be smaller or larger, and need not be symmetrical about the axes, need not surround the TSV, and need not even be adjacent the TSV. For example, if it is known in advance that one or more transistors will be placed in a rectangular region spaced from the TSV along the X-axis, then it is necessary to calculate the stress only within that rectangular region.

In addition, it is necessary to calculate the stresses only at positions on the surface of the substrate or slightly below it, since that is where transistor's current flows. However, the stress distribution at positions below the surface may also be necessary in order to calculate the values at the surface. In an embodiment in which the conductor material 420 has its own internal lattice structure, such as tungsten, the radial non-uniformities in this material can be taken into account as well. In an embodiment in which the strains in conductor material 420 arise due to thermal mismatch, such as for copper, it is difficult to take the internal grain structure into account due to its randomness. A uniformly radial strain is assumed for these materials instead.

Once the stress distribution from the conductive material is estimated, then this information is used in step 712 to determine the formulation and thickness for the stress compensation material 424. For a SiGe stress compensation material, the primary value needed for the formulation is the Ge mole fraction. Roughly, the Ge mole fraction and the material thickness together determine the stress introduced into the substrate immediately adjacent to the TSV (s2 in FIG. 5), whereas the depth to which the sleeve of SiGe material extends vertically into the substrate roughly determines the shape of the curve 512. If the depth of the SiGe sleeve is the same as the depth of the conductor 420, which is typically the case, then the shape of curve 512 will roughly mirror the shape of curve 510 from conductor-introduced stress. If rough cancelation is all that is required, therefore, then the required Ge mole fraction and material thickness can be determined from a pre-calculated look-up table indexed by values of s2.

Alternatively, more precise values for the Ge mole fraction and/or thickness of the SiGe sleeve can be calculated by simulating the stress distribution introduced into the substrate by the SiGe sleeve and varying the Ge mole fraction and thickness values using well known numerical optimization techniques in order to achieve desired net stress distribution (e.g. 0) at desired positions in the substrate. It is noted that SiGe grown epitaxially on the inside sidewall of the TSV in a silicon substrate will have a crystal lattice structure which is similar to that of the silicon. As a result, the stresses introduced into the substrate by an epitaxially grown SiGe stress compensation material will exhibit a deviation from radial uniformity which is very similar to that introduced by the conductor material into the silicon, resulting in reasonably well-matched stress cancelation.

Because the stresses introduced into a crystalline substrate are not uniformly radial, at most points in the subject region on the surface of the substrate, the stress caused by the conductor material 420 has a non-zero tangential component. However, it is the radial component of the stress vector that is most affected by the stress compensation material. Therefore, as used herein, "partial cancelation" of the stress at a particular point refers to a reduction in the magnitude of the radial vector component of the stress at that point. "At least partial cancelation" refers to a reduction of the magnitude of the radial component which might include reducing it to zero or even beyond. That is, the term "at least partial cancellation" includes reversal of the sign of the radial component of the stress, even if the resulting magnitude of the radial component is greater than the magnitude was of the radial component of the original stress vector.

After values have been determined for Ge mole fraction and thickness of the SiGe sleeve 424, in step 714 a device is fabricated. At least three major classes of fabrication process have been discussed which include TSV formation, differentiated by the point in a conventional fabrication process at which the TSV formation steps are inserted. In one class TSVs are formed prior to front-end processing (i.e. before formation of structures below the surface of the substrate, such as diffusions and STIs). In the second class TSVs are formed after front-end processing and before back-end processing (i.e. before formation of structures above the transistors, such as inter-layer dielectrics, contacts and interconnects). In the third class TSVs are not formed until after back-end processing is substantially complete. For convenience, the first, second and third classes are sometimes referred to herein as "via first", "via middle" and "via last" processes, respectively. Aspects of the invention can be included in all of these classes of fabrication processes.

Figure 8A:
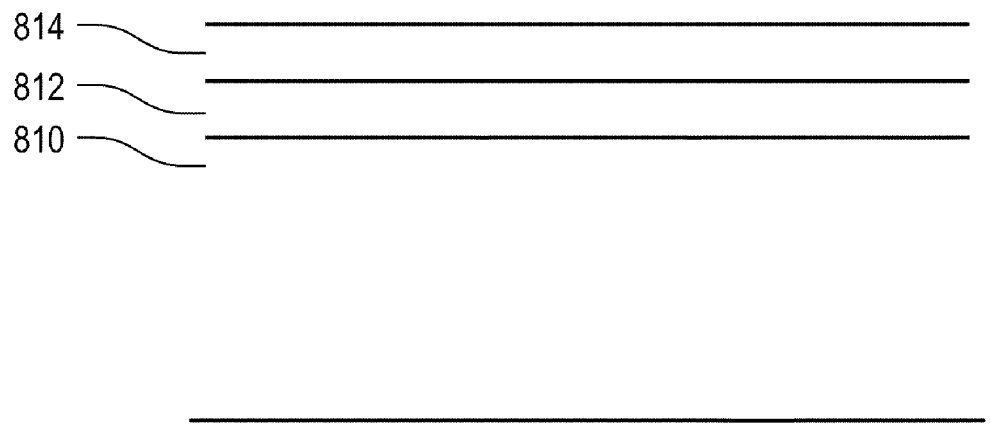
FIGS. 8A-8E (collectively FIG. 8) illustrate a sequence of fabrication steps for formation of a TSV which includes aspects of the invention.

FIGS. 8A-8E (collectively FIG. 8) illustrate a sequence of fabrication steps for formation of a TSV, which includes aspects of the invention. The illustration is for "via first" or "via middle" processes, and it will be apparent how to adapt the sequence for use in "via last" processes. FIG. 8A shows a region of a silicon substrate 810, on which has already been formed an oxide layer 812, and an overlying layer 814 which may for example a nitride or a low-k dielectric. The materials in layers 812 and 814 are not important for purposes of the invention, except that they should not be silicon and they should be patternable as described next. The layers 812 and 814 are formed for other reasons related to device fabrication, so they do not entail additional process steps.

Figure 8B:
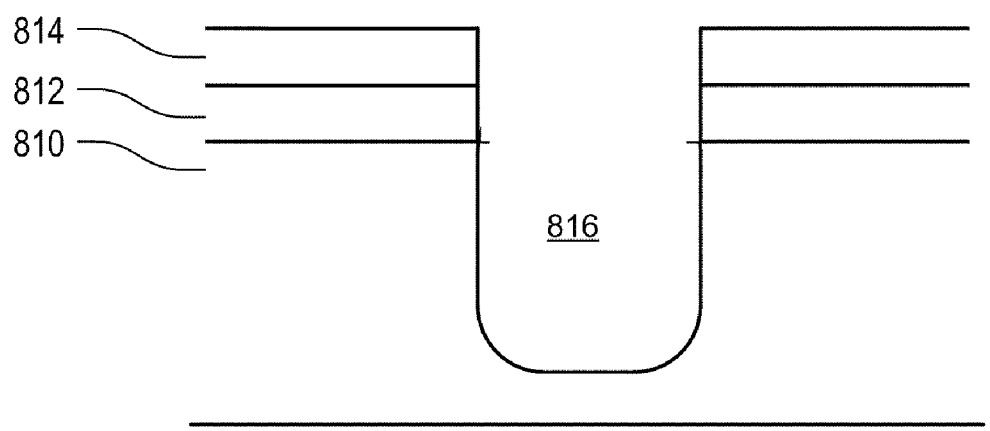

The layers 812 and 814 are then patterned to expose holes where the TSVs will be located, and then holes are etched by well-known means, deep into the substrate for the TSVs. FIG. 8B shows the substrate region of FIG. 8A, into which a hole 816 has been etched for a TSV. The hole is approximately 20-50 microns deep and 2-5 microns in diameter.

Figure 8C:
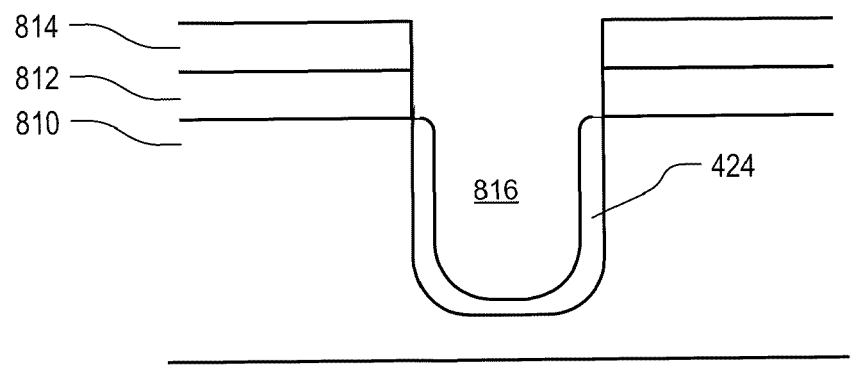

Next, SiGe material 424 is grown epitaxially in the TSV holes 816, as shown in FIG. 8C. Depending on the desired stress profile as determined in step 710, the SiGe material might for example have a Ge mole fraction on the order of 20-30%, and its thickness might be on the order of several tens of nanometers. SiGe epitaxy is a well-known technique used in other steps in many fabrication processes, and the reader will be familiar with its details. It may be performed using for example a gas-phase selective epitaxy process, or any other suitable epitaxial growth process. As shown in FIG. 8C, the SiGe film 424 covers the sidewalls of the TSV hole 816 as well as the bottom of the hole.

Figure 8D:
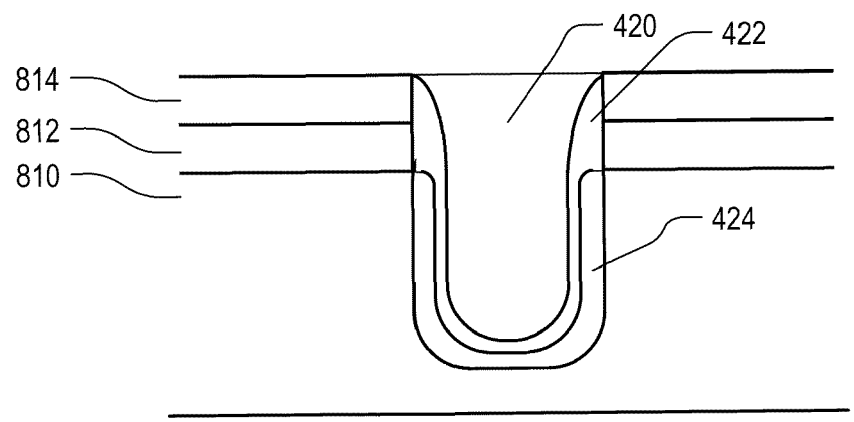

Next, the conventional dielectric buffer oxide 422 is formed on the inside surfaces by known means such as CVD or thermal oxidation. As shown in FIG. 8D, the oxide 422 covers the inside surface of the SiGe material in the hole 816, including the sidewalls and the bottom. The hole is then filled with the conductor material 420 as further shown in FIG. 8D. For example, a thin Cu seed can be deposited using PVD, then the remainder of the hole filled using Cu electroplating.

Figure 8E:
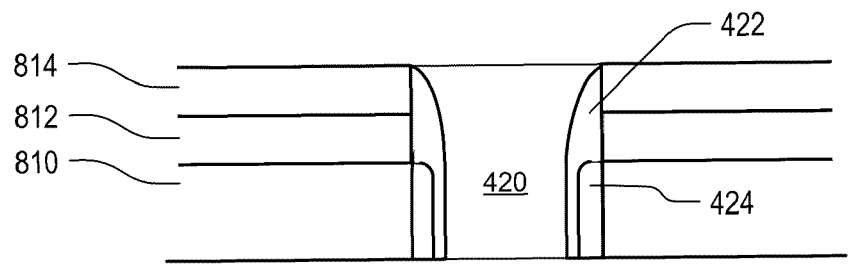

Finally, as shown in FIG. 8E, the wafer is thinned from the back side, for example by a grinding process, until the conductor material 420, the oxide 422 and the stress compensation material 424 are exposed at the backside. This results in the TSV structure as shown in FIG. 5, with the conductor material 420 extending through the entire depth of the wafer, and the SiGe sleeve surrounding its entire depth. The remaining features of the integrated circuit device are then applied in any suitable fashion, typically using conventional techniques. In particular, transistors are formed close to the TSV as shown in FIG. 4, well within what would otherwise have been considered an exclusion zone. For example, for materials and material dimensions that would conventionally warrant an exclusion zone on the order of 5 microns from the edge of the TSV, inclusion of the stress compensation material 424 as described herein can reduce the exclusion zone to a region on the order of 0.5 microns from the edge of the TSV. That is, transistors can be placed such that the nearest point in a diffusion region is only 0.5 microns from the edge of the TSV. Optimization of the process could reduce the exclusion zone even beyond that.

Computer System

Figure 9:
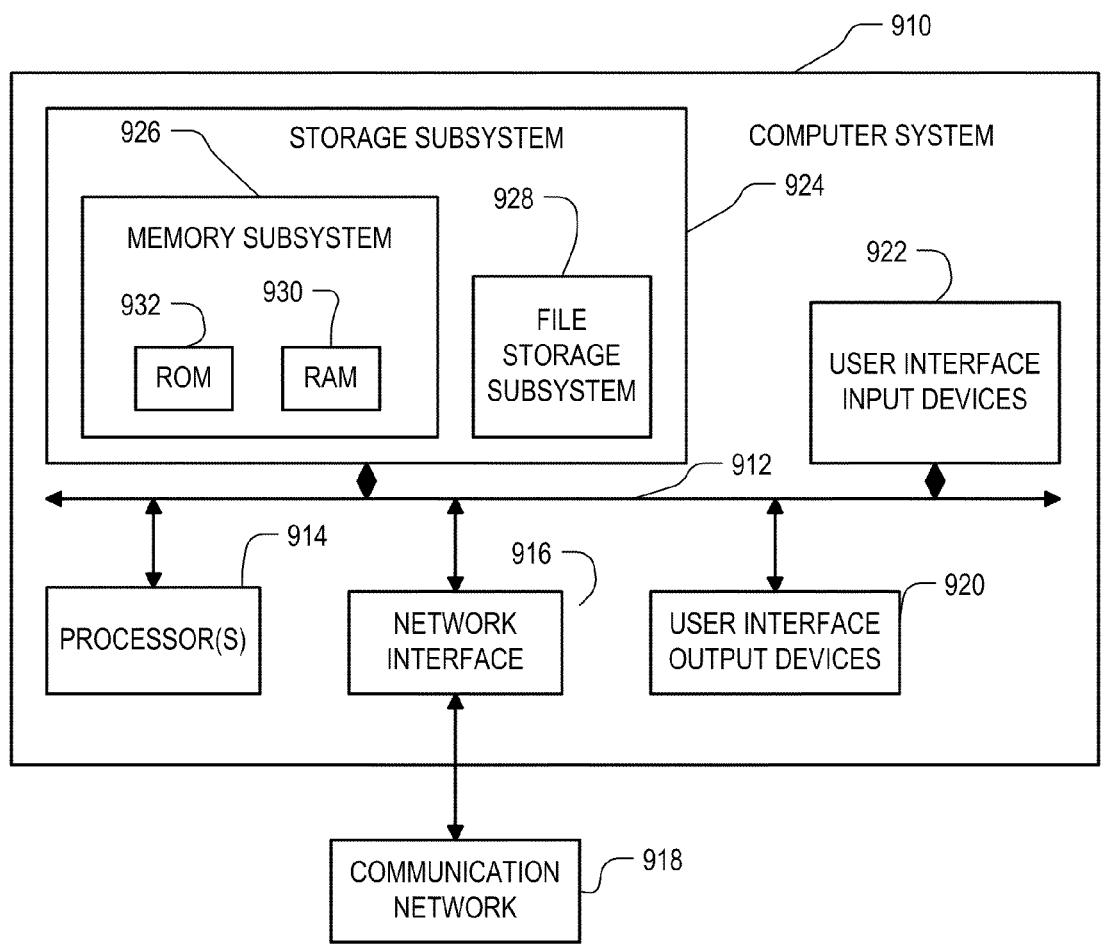
FIG. 9 is a simplified block diagram of a computer system that can be used to implement software incorporating aspects of the present invention.

FIG. 9 is a simplified block diagram of a computer system 910 that can be used to implement software incorporating aspects of the present invention. Computer system 910 typically includes a processor subsystem 914 which communicates with a number of peripheral devices via bus subsystem 912. These peripheral devices may include a storage subsystem 924, comprising a memory subsystem 926 and a file storage subsystem 928, user interface input devices 922, user interface output devices 920, and a network interface subsystem 916. The input and output devices allow user interaction with computer system 910. Network interface subsystem 916 provides an interface to outside networks, including an interface to communication network 918, and is coupled via communication network 918 to corresponding interface devices in other computer systems. Communication network 918 may comprise many interconnected computer systems and communication links. These communication links may be wireline links, optical links, wireless links, or any other mechanisms for communication of information. While in one embodiment, communication network 918 is the Internet, in other embodiments, communication network 918 may be any suitable computer network.

The physical hardware component of network interfaces are sometimes referred to as network interface cards (NICs), although they need not be in the form of cards: for instance they could be in the form of integrated circuits (ICs) and connectors fitted directly onto a motherboard, or in the form of macrocells fabricated on a single integrated circuit chip with other components of the computer system.

User interface input devices 922 may include a keyboard, pointing devices such as a mouse, trackball, touchpad, or graphics tablet, a scanner, a touch screen incorporated into the display, audio input devices such as voice recognition systems, microphones, and other types of input devices. In general, use of the term "input device" is intended to include all possible types of devices and ways to input information into computer system 910 or onto computer network 918.

User interface output devices 920 may include a display subsystem, a printer, a fax machine, or non-visual displays such as audio output devices. The display subsystem may include a cathode ray tube (CRT), a flat-panel device such as a liquid crystal display (LCD), a projection device, or some other mechanism for creating a visible image. The display subsystem may also provide non-visual display such as via audio output devices. In general, use of the term "output device" is intended to include all possible types of devices and ways to output information from computer system 910 to the user or to another machine or computer system.

Storage subsystem 924 stores the basic programming and data constructs that provide the functionality of certain aspects of the present invention. For example, the various modules implementing the functionality of computer-implemented steps in FIG. 7 may be stored in storage subsystem 924. These software modules are generally executed by processor subsystem 914.

Memory subsystem 926 typically includes a number of memories including a main random access memory (RAM) 930 for storage of instructions and data during program execution and a read only memory (ROM) 932 in which fixed instructions are stored. File storage subsystem 928 provides persistent storage for program and data files, and may include a hard disk drive, a floppy disk drive along with associated removable media, a CD ROM drive, an optical drive, or removable media cartridges. The databases and modules implementing the functionality of certain embodiments of the invention may have been provided on a computer readable medium such as one or more CD-ROMs (or may have been communicated to the computer system 910 via the communication network 918), and may be stored by file storage subsystem 928. The host memory 926 contains, among other things, computer instructions which, when executed by the processor subsystem 914, cause the computer system to operate or perform functions as described herein. As used herein, processes and software that are said to run in or on "the host" or "the computer", execute on the processor subsystem 914 in response to computer instructions and data in the host memory subsystem 926 including any other local or remote storage for such instructions and data.

Bus subsystem 912 provides a mechanism for letting the various components and subsystems of computer system 910 communicate with each other as intended. Although bus subsystem 912 is shown schematically as a single bus, alternative embodiments of the bus subsystem may use multiple busses.

Computer system 910 itself can be of varying types including a personal computer, a portable computer, a workstation, a computer terminal, a network computer, a television, a mainframe, or any other data processing system or user device. Due to the ever-changing nature of computers and networks, the description of computer system 910 depicted in FIG. 9 is intended only as a specific example for purposes of illustrating the preferred embodiments of the present invention. Many other configurations of computer system 910 are possible having more or less components than the computer system depicted in FIG. 9.

Also as used herein, a given value is "responsive" to a predecessor value if the predecessor value influenced the given value. If there is an intervening processing element, step or time period, the given value can still be "responsive" to the predecessor value. If the intervening processing element or step combines more than one value, the output of the processing element or step is considered "responsive" to each of the value inputs. If the given value is the same as the predecessor value, this is merely a degenerate case in which the given value is still considered to be "responsive" to the predecessor value. "Dependency" of a given value upon another value is defined similarly.

The foregoing description of preferred embodiments of the present invention has been provided for the purposes of illustration and description. It is not intended to be exhaustive or to limit the invention to the precise forms disclosed. Obviously, many modifications and variations will be apparent to practitioners skilled in this art. In particular, and without limitation, any and all variations described, suggested or incorporated by reference in the Background section of this patent application are specifically incorporated by reference into the description herein of embodiments of the invention. The embodiments described herein were chosen and described in order to best explain the principles of the invention and its practical application, thereby enabling others skilled in the art to understand the invention for various embodiments and with various modifications as are suited to the particular use contemplated. It is intended that the scope of the invention be defined by the following claims and their equivalents.

I claim:

1. An integrated circuit device comprising:
    a substrate including a via passing therethrough;
    a strained electrically conductive first material in the via, the first material tending to introduce first stresses into the substrate; and
    a strained second material in the via, the second material tending to introduce second stresses into the substrate, the second stresses being such as to at least partially cancel the first stresses at least within a subject region of the substrate,
    wherein the substrate is crystalline, wherein the via defines an inside sidewall of the substrate surrounding the via, and wherein the second material is grown epitaxially on the inside sidewall of the via.

2. A device according to claim 1, wherein the substrate is silicon, and wherein the second material is SiGe.

3. A device according to claim 1, further comprising a buffer material in the via and separating the first and second materials, the buffer material tending to absorb part of the strain of one or both if the first and second materials.

4. A device according to claim 3, wherein the buffer material comprises SiO2.

5. An integrated circuit device comprising:
    a silicon substrate including a via passing therethrough;
    a metal conductor in the via; and
    a sleeve of SiGe in the via and surrounding the conductor.

6. A device according to claim 5, wherein the via defines an inside sidewall of the substrate surrounding the via, and wherein the SiGe is grown epitaxially on the inside sidewall of the silicon substrate in the via.

7. A device according to claim 5, further comprising a dielectric barrier sleeve in the via and surrounding the metal conductor.

8. A device according to claim 7, wherein the dielectric barrier sleeve separates the SiGe sleeve from the metal conductor.

9. A device according to claim 8, wherein the dielectric barrier sleeve comprises SiO2.

10. A device according to claim 5, wherein the via defines an inside sidewall of the substrate surrounding the via,
    wherein the SiGe is grown epitaxially on the inside sidewall of the silicon substrate in the via,
    further comprising a SiO2 sleeve in the via and surrounding the metal conductor and separating the SiGe sleeve from the metal conductor.

11. A device according to claim 5, wherein the SiGe sleeve is not doped with impurities.

12. A method for forming an integrated circuit device, comprising the steps of:
    providing a substrate including a via passing therethrough;
    providing a strained electrically conductive first material in the via, the first material tending to introduce first stresses into the substrate;
    providing a strained second material in the via, the second material tending to introduce second stresses into the substrate, the second stresses being such as to at least partially cancel the first stresses at least within a subject region of the substrate; and
    simulating the stress distribution that the conductive material tends to introduce into the substrate,
    wherein the step of providing a strained second material in the via comprises the step of providing a second material having physical characteristics which depend upon the stress distribution from the step of simulating.

13. A method for forming an integrated circuit device, comprising the steps of:
    providing a substrate including a via passing therethrough;
    providing a strained electrically conductive first material in the via, the first material tending to introduce first stresses into the substrate; and
    providing a strained second material in the via, the second material tending to introduce second stresses into the substrate, the second stresses being such as to at least partially cancel the first stresses at least within a subject region of the substrate,
    wherein the substrate is crystalline, wherein the via defines an inside sidewall of the substrate surrounding the via, and wherein the step of providing a strained second material in the via comprises the step of growing the second material epitaxially on the inside sidewall of the via.

14. A method according to claim 13, wherein the substrate is silicon, and wherein the second material is SiGe.

15. A method according to claim 14, wherein the SiGe sleeve is not doped with impurities.

16. A method according to claim 13, further comprising the step of providing a buffer material in the via, the buffer material separating the first and second materials, the buffer material tending to absorb part of the strain of one or both if the first and second materials.

17. A method according to claim 16, wherein the buffer material comprises SiO2.

18. A method for forming an integrated circuit, comprising the steps of:
    providing a silicon substrate including a via passing therethrough;
    forming a metal conductor in the via; and
    forming a sleeve of SiGe in the via and surrounding the conductor.

19. A method according to claim 18, wherein the via defines an inside sidewall of the substrate surrounding the via, and wherein the step of forming a sleeve of SiGe comprises the step of growing the sleeve of SiGe epitaxially on the inside sidewall of the silicon substrate in the via.

20. A method according to claim 19, further comprising the steps of simulating the stress distribution that the metal conductor tends to introduce into the substrate, and determining a desired Ge mole fraction in dependence upon the stress distribution from the step of simulating, and wherein the step of growing the sleeve of SiGe epitaxially comprises the step of growing the SiGe so as to exhibit the desired Ge mole fraction.

21. A method according to claim 19, further comprising the step of simulating the stress distribution that the metal conductor tends to introduce into the substrate, and wherein the step of growing the sleeve of SiGe epitaxially comprises the step of growing the SiGe to a radial thickness in dependence upon the stress distribution from the step of simulating.

22. A method according to claim 18, further comprising the step of forming a dielectric barrier sleeve in the via and surrounding the metal conductor.

23. A method according to claim 22, wherein the dielectric barrier sleeve separates the SiGe sleeve from the metal conductor.

24. A method according to claim 23, wherein the dielectric barrier sleeve comprises SiO2.

25. A method according to claim 18, wherein the via defines an inside sidewall of the substrate surrounding the via, further comprising the step of forming a SiO2 sleeve in the via, the SiO2 sleeve surrounding the metal conductor and separating the SiGe sleeve from the metal conductor, further comprising the step of simulating the stress distribution that the metal conductor tends to introduce into the substrate, and further comprising the step of determining a desired Ge mole fraction in dependence upon the stress distribution from the step of simulating, and wherein the step of forming a sleeve of SiGe comprises the step of growing the sleeve of SiGe epitaxially on the inside sidewall of the silicon substrate in the via, to a radial thickness in dependence upon the stress distribution from the step of simulating, and such that the SiGe exhibits the desired Ge mole fraction.

26. A method according to claim 18, wherein the SiGe sleeve is not doped with impurities.

* * * * *